(12) United States Patent
Seki et al.

(10) Patent No.: US 6,844,568 B2
(45) Date of Patent: Jan. 18, 2005

(54) PHOTOELECTRIC CONVERSION DEVICE AND MANUFACTURING PROCESS THEREOF

(75) Inventors: Yoji Seki, Yokaichi (JP); Takeshi Kyoda, Yokaichi (JP); Yoshio Miura, Yokaichi (JP); Hisao Arimune, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/424,163

(22) Filed: Apr. 25, 2003

(65) Prior Publication Data

US 2004/0007753 A1 Jan. 15, 2004

(30) Foreign Application Priority Data

| Apr. 25, 2002 | (JP) | ..... 2002-123941 |
| May 20, 2002 | (JP) | ..... 2002-145213 |
| Jun. 27, 2002 | (JP) | ..... 2002-187389 |
| Jul. 23, 2002 | (JP) | ..... 2002-214399 |
| Jul. 29, 2002 | (JP) | ..... 2002-220183 |

(51) Int. Cl.$^7$ ............................................. H01L 29/04
(52) U.S. Cl. ......................... 257/64; 257/759; 257/791
(58) Field of Search .......................... 257/64, 759, 791

(56) References Cited

U.S. PATENT DOCUMENTS 6,784,512 B2 * 8/2004 Yamaguchi et al. ........ 257/440
2004/0000715 A1 * 1/2004 Interrante et al. ........... 257/758

FOREIGN PATENT DOCUMENTS

JP 52-23273 * 2/1977

* cited by examiner

Primary Examiner—Nathan J. Flynn
Assistant Examiner—Ahmed N. Sefer
(74) Attorney, Agent, or Firm—Hogan & Hartson LLP (57) ABSTRACT

There is disclosed a photoelectric conversion device which is manufactured by depositing numerous crystalline semiconductor particles of one conductivity type on a substrate having an electrode of one side to join the crystalline semiconductor particles to the substrate, interposing an insulator among the crystalline semiconductor particles, forming a semiconductor layer of the opposite conductivity type over the crystalline semiconductor particles, and connecting an electrode to the semiconductor layer of the opposite conductivity type, in which the insulator comprises a mixture or reaction product of polysiloxane and polycarbosilane. The insulator interposed among the crystalline semiconductor particles is free from defects such as cracking and peeling, so that a low cost photoelectric conversion device with high reliability can be provided.

17 Claims, 2 Drawing Sheets

PHOTOELECTRIC CONVERSION DEVICE AND MANUFACTURING PROCESS THEREOF

This application is based on applications Nos. 2002-123941, 2002-145213, 2002-187389, 2002-214399, and 2002-220183 filed in Japan, the content of which is incorporated hereinto by reference.

BACKGROUND OF THE INVENTION

1. Field of the Invention

The present invention relates to a photoelectric conversion device and a manufacturing process thereof used for purposes such as photovoltaic power generation. In particular, the present invention relates to a photoelectric conversion device using crystalline semiconductor particles and a manufacturing process thereof.

2. Description of the Related Art

There is a known photoelectric conversion device which includes numerous crystalline semiconductor particles of one conductivity type deposited on a substrate having an electrode of one side and joined thereto, an insulator interposed among the crystalline semiconductor particles, a semiconductor layer of the opposite conductivity type provided over the crystalline semiconductor particles, and an electrode of another side connected to the semiconductor layer of the opposite conductivity type.

For the insulator in the above photoelectric conversion device, a heat-resistant inorganic material, for example, silicon oxide is employed.

However, when such a heat-resistant inorganic material is used, a problem arises in that defects such as cracking and peeling are generated in the insulator and crystalline semiconductor particles in the film deposition process using CVD or the like for forming the semiconductor layer of the opposite conductivity type over the crystalline semiconductor particles.

It is a primary object of the present invention to provide a low cost photoelectric conversion device with high performance and reliability and a manufacturing process thereof by adopting a material that is unlikely to cause generation of defects as the material for the insulator to fill interstices among the semiconductor particles.

DESCRIPTION OF THE RELATED ART

A photoelectric conversion device according to the present invention comprises a substrate, numerous crystalline semiconductor particles deposited on the substrate and joined thereto via alloy portions melted between the substrate and the crystalline semiconductor particles by application of heat, and an insulator interposed among the numerous crystalline semiconductor particles, in which an organic-inorganic composite comprising a mixture or reaction product of polysiloxane and polycarbosilane is used for the insulator. With this structure, generation of defects such as cracking and peeling in the insulator and crystalline semiconductor particles can be prevented. Accordingly, it is possible to form a stable insulator so as to ensure separation of the positive electrode from the negative electrode. In addition, since this structure allows for lower accuracy of particle diameter, the manufacturing margin can be improved. Accordingly, it is possible to provide a low cost photoelectric conversion device with high reliability.

When an inorganic filler is added to the mixture or reaction product of polysiloxane and polycarbosilane, generation of defects such as cracking and peeling in the insulator and crystalline semiconductor particles can be more reliably prevented. Thus, it is possible to provide a photoelectric conversion device with higher reliability.

A photoelectric conversion device according to the present invention comprises a substrate, numerous crystalline semiconductor particles deposited on the substrate and joined thereto via alloy portions melted between the substrate and the crystalline semiconductor particles by application of heat, and an insulator interposed among the numerous crystalline semiconductor particles, in which a mixture comprising an organic-inorganic composite containing Si and a hydrolyzate of alkoxysilane is used for the insulator. With this structure, generation of defects such as cracking and peeling in the insulator and crystalline semiconductor particles can be prevented. Accordingly, it is possible to form a stable insulator so as to ensure separation of the positive electrode from the negative electrode. In addition, since this structure allows for lower accuracy of particle diameter, the manufacturing margin can be improved. Thus, it is possible to manufacture a low cost photoelectric conversion device with high reliability.

When an inorganic filler is added to the mixture of an organic-inorganic composite containing Si and a hydrolyzate of alkoxysilane, generation of cracking and peeling in the insulator and crystalline semiconductor particles is more reliably prevented, so that it is possible to provide a photoelectric conversion device with higher reliability.

A process of manufacturing a photoelectric conversion device according to the present invention comprises the steps of: depositing numerous crystalline semiconductor particles of one conductivity type on a substrate having an electrode of one side and applying heat thereto so as to join the crystalline semiconductor particles to the substrate; forming a coating having liquid repellency on the crystalline semiconductor particles; applying a solution or liquid dispersion of an insulating material over the crystalline silicon particles and performing a heat treatment so as to interpose the insulating material among the crystalline semiconductor particles; forming a semiconductor layer of the opposite conductivity type over the crystalline semiconductor particles; and connecting an electrode of another side to the semiconductor layer of the opposite conductivity type. By this process, it is possible to selectively form a coating having liquid repellency only on the crystalline semiconductor particles and interpose the insulating material among the crystalline semiconductor particles. Therefore, the thickness of the insulator can be easily controlled, so that generation of defects such as cracking and peeling in the insulator and crystalline semiconductor particles can be prevented. Accordingly, it is possible to ensure separation of the positive electrode from the negative electrode by the insulator. In addition, this process allows for lower accuracy of the particle size, so that the manufacturing margin can be improved. As a result, it is possible to provide a low cost manufacture of photoelectric conversion devices. In addition, since the insulator can be formed without allowing the insulating material to remain on the crystalline semiconductor particles, adequate pn-junction area can be provided. Thus, it is possible to manufacture a photoelectric conversion device having higher conversion efficiency than conventional photoelectric conversion devices.

In addition, the process of forming a coating having liquid repellency over the crystalline semiconductor particles can be performed such that after a coating having liquid repellency is temporarily formed on both the crystalline semiconductor particles and the substrate, only the coating on the substrate is selectively removed.

Also, the process of forming a coating having liquid repellency over the crystalline semiconductor particles can be performed such that a first liquid is filled up to approximately half or less the height of the crystalline semiconductor particles and a solution which contains a liquid repellent agent dissolved in a second liquid which is immiscible with the first liquid and has a smaller specific gravity than the first liquid is applied over the first liquid until the crystalline semiconductor particles are immersed, and thereafter both of the liquids are removed, thereby only the coating on the substrate and on the lower surfaces of the crystalline semiconductor particles can be selectively removed.

Specific embodiments of the present invention are now described referring to the drawings.

DETAILED DESCRIPTION OF THE INVENTION

<Photoelectric Conversion Device and Manufacturing Process thereof 1>

Figure 1:
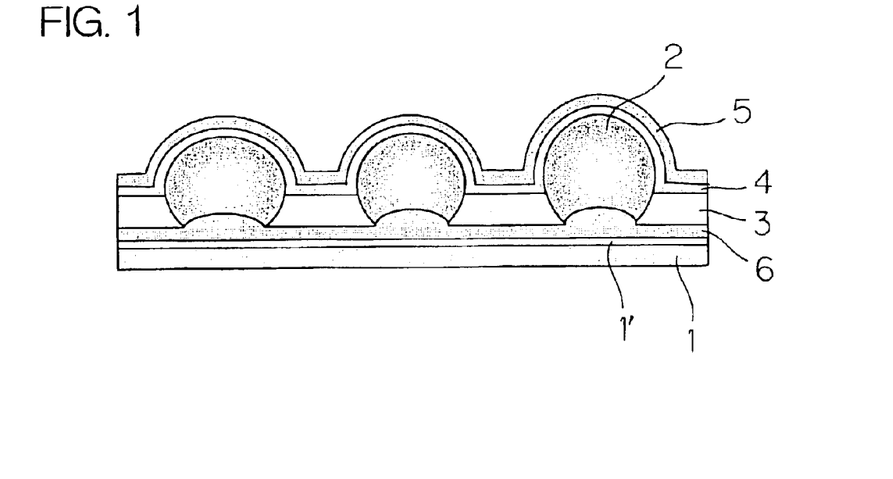
FIG. 1 is a cross-sectional view showing a photoelectric conversion device according to one embodiment of the present invention.

FIG. 1 is a cross-sectional view showing a photoelectric conversion device according to one embodiment of the present invention. In FIG. 1, there are shown a substrate 1, crystalline semiconductor particles 2, an insulator 3, a semiconductor layer 4 of a conductivity type opposite to that of the crystalline semiconductor particles, a conductive layer 5, and an alloy layer 6 comprising an alloy of the substrate 1 and crystalline semiconductor particles 2.

The insulator 3 comprises an insulating material for separating the positive electrode from the negative electrode, which comprises one of the following:

a. a mixture or reaction product of polysiloxane and polycarbosilane b. a mixture or reaction product of polysiloxane and polycarbosilane and an inorganic filler c. a mixture of an organic-inorganic composite containing Si and a hydrolyzate of alkoxysilane d. a mixture of an organic-inorganic composite containing Si and a hydrolyzate of alkoxysilane and an inorganic filler.

The substrate 1 includes a base substrate comprising a metal or a ceramic material having a melting point higher than that of aluminum. For the base substrate, for example, iron, stainless steel, invar, iron alloys such as Fe—Co—Ni alloys of low expansion coefficient, nickel, or ceramics such as alumina are used. An electrode layer 1' comprising aluminum is formed on the base substrate. One or a plurality of elements selected from the group consisting of silicon, magnesium, manganese, chromium, titanium, nickel, zinc, silver, and copper may be added to the layer 1' comprising aluminum. By the addition of such elements, the crystalline semiconductor particles 2 can be prevented from being excessively melted upon joining. The thickness of the layer 1' comprising aluminum is preferably not less than 20 $\mu$m. At thicknesses less than 20 $\mu$m, the layer 1' is too thin to accomplish sufficient contact with the crystalline semiconductor particles at the time of joining.

Figure 2:
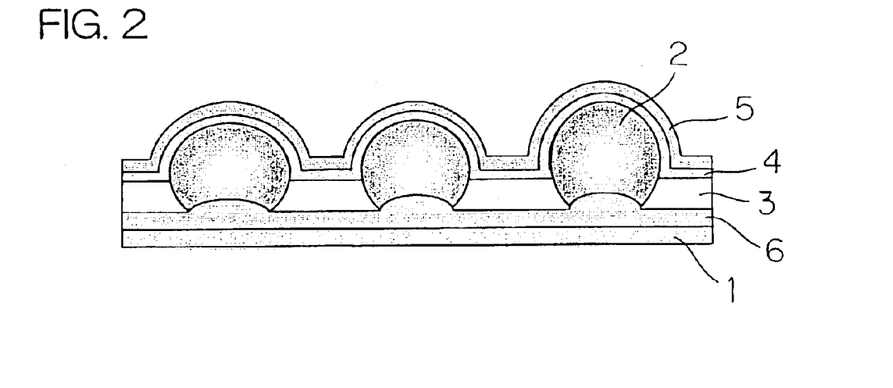
FIG. 2 is a cross-sectional view showing a photoelectric conversion device of another embodiment in which a single layer of aluminum is employed as substrate 1.

The substrate 1 may comprise a single layer of aluminum as shown in FIG. 2. In this case, an alloy layer 6 comprising the substrate material and silicon is formed in a surface portion of the substrate 1 when the substrate 1 and crystalline semiconductor particle 2 are joined together by heating.

A description will be given referring to FIG. 1.

In FIG. 1, numerous crystalline semiconductor particles 2 of a first conductivity type are deposited on the substrate 1. The type of crystal of the crystalline semiconductor particles 2 includes monocrystalline and polycrystalline. The crystalline semiconductor particles 2 comprise Si doped with small amount of a p-type impurity such as B, Al or Ga, or Si doped with small amount of an n-type impurity such as P or As. The shapes of the crystalline semiconductor particles may be polygons, curved surfaces, or the like. The particle size may be even or uneven. However, uneven particle sizes will be advantageous to make the device more economical, because an additional process is necessary in order to uniformize the particle sizes. Also, having convex surfaces reduces the dependence on the incident angle of light.

Preferably, the particle sizes of the crystalline semiconductor particles 2 are in the range of 0.2–1.0 mm. Using crystalline semiconductor particles with particle sizes exceeding 1.0 mm makes no difference in quantity of silicon from the amount used in conventional crystal plate type photoelectric conversion devices including the amount of ground part, which nullifies the advantage of using crystalline semiconductor particles. In addition, crystalline semiconductor particles with particle sizes less than 0.2 mm are difficult to be deposited on the substrate 1, which is another problem. More desirably, the particle sizes are in the range of 0.2–0.6 mm, considering the amount of silicon for use.

A process for depositing numerous crystalline semiconductor particles 2 on the substrate 1 is as follows: a joining-aide layer that functions to bond and fix the crystalline semiconductor particles 2 to the surface of the substrate 1 is formed on the substrate 1, and the crystalline semiconductor particles 2 are deposited thereon, and then extra crystalline semiconductor particles 2 are dropped. This makes it possible to deposit the crystalline semiconductor particles 2 stably and densely, irrespective of the particle size. Subsequently, with a constant amount of load applied to the crystalline semiconductor particles 2, they are heated at a temperature higher than 577.degree.C., which is the eutectic temperature of aluminum in the substrate 1 and silicon in the crystalline semiconductor particles 2. Through this process, the substrate 1 and the crystalline semiconductor particles 2 are joined together with the alloy layer 6 comprising an alloy of the substrate 1 and the crystalline semiconductor particles 2 in between, while the joining-aide layer is removed by the heat.

Incidentally, in the first conductivity type region that is in contact with the alloy layer 6, aluminum, which is the material of the substrate 1, is dispersed and a p$^+$ layer is formed. If formation of a conductive diffusion region is simply intended for, heating at a temperature below the eutectic temperature of Al and Si i.e., 577.degree.C., will serve the purpose. However, in such a case, it is feared that the contact between the substrate 1 and the crystalline semiconductor particles 2 is so weak that the crystalline semiconductor particles leave the substrate, failing to maintain the structure as a solar cell.

The material for the joining-aide layer may be of any kind as long as it disappears at temperatures not lower than 300.degree.C., preferably not lower than 250.degree.C., and below the temperature at which the substrate 1 and crystalline semiconductor particles 2 are joined. In cases where the process is performed in an oxidizing atmosphere, an organic solution in which resin such as butyral, methylcellulose, ethylcellulose, polyvinyl alcohol (PVA), or polyethylene glycol (PEG) is dissolved in a solvent may be used. The process for forming the joining-aide layer may be a screen printing method, the doctor blade technique, spraying, dipping or the like, by which the joining-aide layer is formed on the surface of the substrate 1 with a thickness of 10–100 μm.

Now, materials for the insulator 3 are described one by one as a., b., c., and d.

a. The insulator 3 comprises a thermosetting transparent organic-inorganic composite mainly composed of polysiloxane and polycarbosilane, wherein the polysiloxane contains the following structural unit (A)

(A):

where R1 and R2 may be the same or different and represent any of a lower alkyl group, phenyl group, or hydrogen atom.

In order to improve the heat resistance, it is preferred that at least one of R1 and R2 comprises a phenyl group.

Since polysiloxane maintains flexibility after it is thermally cured, as the polysiloxane content is increased, cracking becomes less likely to occur, so that an insulator 3 as thick as several tens μm can be easily formed. However, on the other hand, as the polysiloxane content increases, the surface strength is lowered, and also the chemical resistance, weatherability, and adhesion are lowered.

Meanwhile, polycarbosilane contains the following structural unit (B)

(B):

where R3 and R4 may be the same or different and represent any of a lower alkyl group, phenyl group, hydrogen atom or metal alkoxyl group.

In order to improve the thermosetting properties, it is preferred that at least one of R3 and R4 comprises a hydrogen atom.

Meanwhile, polycarbosilane becomes a polymer with a high stiffness when thermally cured. Therefore, when the polycarbosilane content is large, cracking is likely to occur, so that it is difficult to form a thick insulator 3. On the other hand, as the polycarbosilane content increases, the surface strength is improved, and also the chemical resistance, weatherability, and adhesion are improved.

In order that the insulator has a good formability, surface strength, chemical resistance, weatherability, and adhesion at the same time, the weight ratio of polycarbosilane to polysiloxane is preferably between 0.1 and 2.0, more preferably, between 0.1 and 1.0, still more preferably, between 0.2 and 1.0, and still further preferably, between 0.2 and 0.6.

b. The insulator 3 comprises a thermosetting transparent organic-inorganic composite mainly composed of polysiloxane and polycarbosilane and an inorganic filler.

In order that the insulator has a good formability, surface strength, chemical resistance, weatherability, and adhesion at the same time, the weight ratio of polycarbosilane to polysiloxane is preferably between 0.1 and 2.0, and more preferably, between 0.2 and 1.0.

In this embodiment, an inorganic filler is added to the aforementioned mixture or reaction product of polysiloxane and polycarbosilane. It is preferred that the inorganic filler comprises SiO$_2$ or a glass containing SiO$_2$ in terms of optical index of refraction, optical transmittance, weatherability, environmental friendliness, stability of supply, and cost. When the inorganic filler comprises SiO$_2$ or a glass containing SiO$_2$, the etching rate during the formation of the insulator 3 can be controlled so that etching can be accomplished without formation of gaps at the interfaces between the crystalline semiconductor particles and the insulator. Accordingly, the semiconductor layer 4 of the opposite conductivity type formed over the crystalline semiconductor particles 2 and the electrode 5 formed on the semiconductor layer 4 can be formed continuously. As a result, high photoelectric conversion efficiency can be achieved.

The weight ratio of the inorganic filler to the total solid content of the polysiloxane and polycarbosilane is preferably not more than 0.25. When it is more than 0.25, another problem arises in that the insulator becomes hard to be filled into the interstices among the crystalline semiconductor particles 2, so that the insulation performance deteriorates. More preferably, it is not more than 0.1.

Preferably, the inorganic filler has an average particle size of not less than 0.1 μm and not more than 10 μm. When the average particle size is less than 0.1 μm, agglomeration is prone to occur, so that the filling efficiency and the like in filling the interstices among the crystalline semiconductor particles 2 deteriorate. On the other hand, when the average particle size is more than 10 μm, the formability deteriorates, causing the problem of insulation failure. More preferably, the inorganic filler has an average particle size of not less than 1 µm and not more than 8 µm.

It is preferred that the inorganic filler has an optical index of refraction of not less than 1.4 and not more than 1.7. In cases where the optical index of refraction of the inorganic filler is less than 1.4 or more than 1.7, the difference in optical index of refraction between the inorganic filler and the mixture or reaction product of polysiloxane and polycarbosilane becomes great, which leads to an increase in surface reflectance of the insulator 3. For this reason, light beams that are not directly incident on the crystalline semiconductor particles cannot be utilized effectively, and as a result, the photoelectric conversion efficiency drops. More preferably, the inorganic filler has an optical index of refraction of not less than 1.5 and not more than 1.6.

c. The insulator 3 comprises a mixture of a thermosetting transparent organic-inorganic composite mainly composed of polysiloxane or a mixture of polysiloxane and polycarbosilane and a hydrolyzate of alkoxysilane.

The polysiloxane contains the aforestated structural unit (A). In order to improve the heat resistance, preferably at least one of R1 and R2 comprises a phenyl group.

Meanwhile, the polycarbosilane contains the aforestated structural unit (B). In order to improve the thermosetting properties, it is preferred that at least one of R3 and R4 comprises a hydrogen atom.

The hydrolyzate of alkoxysilane is preferably a hydrolyzate produced by hydrolysis of a single compound or mixture of alkoxysilanes using a basic catalyst such as ammonia, in which the alkoxysilane has an organic functional group represented by the following chemical formula (C)

(C):

where each of R1, R2, and R3 is one of the group consisting of $CH_3$, $C_2H_3$, $C_2H_5$, $C_3H_7$, $C_6H_5$, $CH_3O$, $C_2H_5O$ and $C_3H_7O$, and R4 is one of the group consisting of $CH_3$, $C_2H_5$ and $C_3H_7$. When a basic catalyst is used, the hydrolyzate is densely scattered throughout the insulator layer as numerous three-dimensional spherical particles, thereby the function of a filler is accomplished. However, hydrolyzates prepared using an acid catalyst are unfavorable because their molecules are linearly arranged and entangled forming an enormous network, thereby causing defects such as cracking. The amount of water for the hydrolysis relative to the (amount of) alkoxysilane is preferably 0.5–2 by molar ratio, and preferably, 0.01 to 5% aqueous ammonia solution is used. In addition, alcohol such as isopropyl alcohol may be used to promote even reaction in the hydrolysis.

In order that the insulator has a good formability, surface strength, chemical resistance, weatherability, and adhesion at the same time, it is preferable that, in the mixture of an organic-inorganic composite containing Si and a hydrolyzate of alkoxysilane, the weight ratio of the former to the latter is between 0.005 and 0.3, more preferably, it is not less than 0.01 and not more than 0.2, and further preferably, it is not less than 0.015 and not more than 0.1.

Since the etching rate during the formation of the insulator 3 can be controlled by the hydrolyzate of alkoxysilane contained in the insulator 3, etching can be accomplished without formation of gaps at the interfaces between the crystalline semiconductor particles and the insulator.

Accordingly, the semiconductor layer 4 of the opposite conductivity type formed over the crystalline semiconductor particles 2 and the electrode 5 formed on the semiconductor layer 4 can be formed continuously. As a result, high photoelectric conversion efficiency can be achieved.

d. The insulator 3 comprises a mixture of an organic-inorganic composite containing Si, a hydrolyzate of alkoxysilane, and an inorganic filler. The organic-inorganic composite containing Si is preferably polysiloxane or a mixture of polysiloxane and polycarbosilane.

The weight ratio of the inorganic filler to the organic-inorganic composite containing Si is preferably not more than 0.25. When it is more than 0.25, another problem arises in that the insulator becomes hard to be filled into the interstices among the crystalline semiconductor particles 2, so that the insulation performance deteriorates. More preferably, it is 0.1 or less.

The average particle size of the inorganic filler is preferably between 0.1 µm and 10 µm. When the average particle size is less than 0.1 µm, agglomeration is prone to occur, so that the filling efficiency and the like in filling the interstices among the crystalline semiconductor particles 2 deteriorate. However, on the other hand, when the average particle size is more than 10 µm, the formability deteriorates causing the problem of insulation failure. More preferably, the inorganic filler has an average particle size between 1 µm and 8 µm.

It is preferred that the inorganic filler has an optical index of refraction of not less than 1.4 and not more than 1.7. In cases where the optical index of refraction of the inorganic filler is less than 1.4 or more than 1.7, the difference in optical index of refraction between the inorganic filler and the mixture or reaction product of polysiloxane and polycarbosilane becomes great, which leads to an increase in surface reflectance of the insulator 3. For this reason, light beams that are not directly incident on the crystalline semiconductor particles cannot be utilized effectively, and as a result, the photoelectric conversion efficiency drops. More preferably, the inorganic filler has an optical index of refraction of between 1.5 and 1.6.

The insulating materials from a. to d. above are dissolved in an organic solvent when used. For the organic solvent, benzene, toluene, xylene, hexane, tetrahydrofuran or the like may be used. Among them, xylene is particularly preferable in terms of solubility, volatility, toxicity, and cost.

In consideration of factors such as formability of the insulator 3, layer thickness after heating, repellency on the crystalline semiconductor particles 2 and viscosity, it is preferred that the density of the solution is not less than 20% and not more than 50%.

Prior to the application of a solution comprising a mixture of any of the insulating materials from a. to d. and an organic solvent, a coating having liquid repellency is formed on the crystalline semiconductor particles 2. Here, the process is conducted so that the coating is not formed on the substrate 1. As a result of preventing the insulating material from adhering to the surfaces of the crystalline semiconductor particles 2 after heat treatment by the repellency of the coating, the aperture ratio (ratio of pn-junction planes on the crystalline semiconductor particles 2) increases, and hence the conversion efficiency is improved. For the coating having liquid repellency, compounds having a long chain alkyl group or perfluoroalkyl group may be used, and in particular, fluorine-containing silane coupling agents, perfluorosilicone and perfluoropolysilaxane are effective for this purpose.

Meanwhile, it is preferred that the temperature of heat for the heat treatment for curing after the application of the solution comprising a mixture of an insulating material and an organic solvent onto the substrate 1 is not less than 250.degree.C. and not more than 400.degree.C. When the temperature for the heat treatment is lower than 250.degree.C., gas is generated due to the heat-decomposition of a functional group not activated and remaining in the insulator 3 being heated up during the process such as CVD (Chemical Vapor Deposition) process by which the opposite conductivity type semiconductor layer 4 is formed over the crystalline semiconductor particles 2, which deteriorates the quality of the semiconductor layer 4. However, on the other hand, when the temperature for the heat treatment exceeds 400.degree.C., the organic component in the insulator 3 begins to be sublimated intensely, and therefore cracking and brown or black coloration occurs leading to loss of translucency.

In addition, in order to effectively utilize light that is not directly incident on the crystalline semiconductor particles 2, it is preferred that the transmittance of the insulator 3 for light at wavelengths of 400–800 nm is 70% or more.

The thickness of the insulator 3 is preferably from 1 to 250 $\mu$m, and more preferably, from 3 to 250 $\mu$m. When the thickness is less than 1 $\mu$m, the insulation performance becomes unstable to cause leak current to flow. However, on the other hand, when the thickness exceeds 250 $\mu$m, cracking is likely to occur, so that the weatherability and adhesion deteriorate.

The insulator 3 preferably has a pencil hardness of HB to 4H, and more preferably, HB to 3H. When the hardness is less than HB in pencil hardness, the chemical resistance and the like drop. Therefore, there are times when the insulator 3 is destroyed during the process such as CVD (Chemical Vapor Deposition) process by which the opposite conductivity type semiconductor layer 4 is formed over the crystalline semiconductor particles 2. However, on the other hand, when the hardness exceeds 4H in pencil hardness, cracking is likely to occur during the formation of the insulator 3, leading to lowering of the conversion efficiency.

The semiconductor layer 4 comprises, for example, Si, and is formed by a vapor-phase growth method or the like in which, for example, a vapor-phase phosphorus-containing compound that is an n-type impurity or a vapor-phase boron-containing compound that is a p-type impurity is introduced in small amount into a vapor-phase silane compound. The semiconductor layer may be of crystalline, amorphous, or mixture of crystalline and amorphous quality. When the light transmittance is taken into consideration, it is preferable that the layer is of crystalline or a mixture of crystalline and amorphous quality.

As for the light beam transmittance, a part of incident light penetrates the semiconductor layer 4 at areas where the crystalline semiconductor particles 2 are not present, and is reflected by the substrate 1 and directed to the crystalline semiconductor particles 2. This enables energy of light incident on the whole photoelectric conversion device to be efficiently transmitted to the crystalline semiconductor particles 2.

As for the conductivity, the concentration of microelement in the semiconductor layer 4 may be, for example, on the order of $1 \times 10^{16}$–$1 \times 10^{19}$ atm/cm$^3$.

In addition, the semiconductor layer 4 preferably is formed along the contours of the convex surfaces of the crystalline semiconductor particles 2. By forming the semiconductor layer 4 along the convex surfaces of the crystalline semiconductor particles 2, large area can be provided for p-n junctions. Accordingly, carriers generated inside the crystalline semiconductor particles 2 can be efficiently collected. Meanwhile, when the crystalline semiconductor particles 2 to be used each have a surface layer containing small amount of an n-type impurity such as P or As, or a p-type impurity such as B, Al or Ga, the semiconductor layer 4 may be spared, and the conductive layer 5 is formed directly over the crystalline semiconductor particles 2.

The conductive layer 5 is formed by a film-forming process such as sputtering, a vapor-phase growth method or a coat and fire process to form an oxide-based film composed of one or a plurality of compounds selected from the group consisting of $SnO_2$, $In_2O_3$, ITO, ZnO, $TiO_2$ and the like, or a metal-based film composed of one or a plurality of metals selected from the group consisting of Ti, Pt, Au and the like. In addition, the conductive layer 5 needs to be transparent so that a part of incident light penetrates the conductive layer 5 at areas where the crystalline semiconductor particles 2 are not present and is reflected by the substrate 1 and directed to the crystalline semiconductor particles 2. This enables energy of light incident on the whole photoelectric conversion device to be efficiently transmitted to the crystalline semiconductor particles 2.

The transparent conductive layer 5 can have the effect of an antireflective film if the thickness is selected for that purpose.

A protective layer (not shown) may be formed on the semiconductor layer 4 or on the conductive layer 5.

It is preferable for such a protective layer to have the properties of a transparent dielectric. It is formed by the CVD method, the PVD method or the like, in which, for example, one or a plurality of materials selected from the group consisting of silicon oxide, cesium oxide, aluminum oxide, silicon nitride, titanium oxide, $SiO_2$—$TiO_2$, tantalum oxide, yttrium oxide are used to form a single layer or a combined layer on the semiconductor layer 4 or on the conductive layer 5. The protective layer needs to have transparency, because it is in contact with the surface where light is incident, and in order to prevent current leakage from occurring between the outside and the semiconductor layer 4 or the conductive layer 5, it needs to be a dielectric. It is possible to provide the protective layer with the function of an antireflective film by optimizing the thickness of the layer for that purpose.

Moreover, it is also possible to provide a patterned electrode (not shown) comprising fingers and bus bars at regular intervals on the semiconductor layer 4 or on the conductive layer 5 so that the patterned electrode is directly or indirectly connected to the semiconductor layer 4 so as to lower the series resistance, thereby improving the conversion efficiency.

EXAMPLE 1

The present invention is hereinafter described based on examples and comparative examples.

Example 1-1

A 50 $\mu$m thick aluminum alloy was attached onto a stainless steel base by cold welding so as to form a substrate 1. Then, a joining-aide layer was formed such that a butyral resin dissolved in an organic solvent was applied to the substrate 1 to a thickness of 50 $\mu$m by using the doctor blade technique. On top of the layer, p-type silicon particles 2 having diameters of 0.3–0.5 mm were deposited several times so that the p-type silicon particles 2 were adequately bonded to the joining-aid layer, and then extra p-type silicon particles 2 were removed by inclining the substrate 1. Thereafter, with the p-type silicon particles 2 being kept pressed and still by application of a constant load, heat at a temperature of 630.degree.C. was applied for 10 minutes in atmospheric air so as to join the p-type silicon particles 2 to the aluminum alloy.

A fluorine-containing liquid repellant agent was applied onto the sample and dried at room temperature. Thereafter, a solution prepared by mixing polysiloxane, polycarbosilane and xylene at a weight ratio of 2:1:6 was applied so as to fully cover the p-type silicon particles 2. It is then dried at room temperature, and heat treated at 330.degree.C. for 30 minutes. The obtained transparent polysiloxane-polycarbosilane composite 3 had a thickness of about 150 μm in an area where the p-type silicon particles 2 were densely deposited, and had a thickness of about 20 μm in an area where the p-type silicon particles 2 were not densely deposited.

Another polysiloxane-polycarbosilane composite 3 was formed on a glass substrate under the same conditions, which had a pencil hardness of H, and a transmittance of 80% or more for light at wavelengths of 400–800 nm.

In order to clean the upper surfaces of the p-type silicon particles 2, the substrate 1 on which the polysiloxane-polycarbosilane composite 3 was interposed among the p-type silicon particles 2 was immersed in a hydrofluoric acid-nitric acid mixture solution (HF:HNO$_3$=1:20) for 1 minute, and then thoroughly cleaned with pure water. Subsequently, an n-type semiconductor layer 4 comprising a mixture of crystalline silicon and amorphous silicon was formed to a thickness of 50 nm on the p-type silicon particles 2 by plasma CVD method using a mixed gas containing a silane gas and small amount of a phosphorus compound, and then a 100 nm thick ITO film 5 was formed on the semiconductor layer 4 by sputtering.

After a pattern electrode comprising fingers and bus bars was formed on top of them, the photoelectric conversion efficiency was measured, and a relatively high conversion efficiency of 9.3% was achieved. The sample was subjected to 500 cycles of temperature cycling test at −40.degree.C. to 90.degree.C. As a result, no cracking or peeling occurred in the insulator 3 and the photoelectric conversion efficiency was 9.0%. Almost no property deterioration was observed.

Comparative Example 1-1a

A sample was fabricated under the same conditions as Example 1-1 except that a solution in which polysiloxane and xylene were mixed at a weight ratio of 1:3 was used for the insulator 3. A transparent sample without defects such as cracking and peeling was obtained. However, another insulator on a glass substrate formed under the same conditions had a pencil hardness of B. Although an initial photoelectric conversion efficiency of 8.8% was achieved, after the sample was subjected to 500 cycles of temperature cycle test at −40.degree.C. to 90.degree.C., cracking occurred in the insulator 3, resulting in a photoelectric conversion efficiency of 0%.

Comparative Example 1-1b

A sample was fabricated under the same conditions as Example 1-1 except that a solution in which polycarbosilane and xylene were mixed at a weight ratio of 1:3 was used for the insulator 3. Cracking occurred all over the insulator 3, and the photoelectric conversion efficiency was 0%.

Example 1-2

A 50 μm thick aluminum alloy was attached onto a stainless steel base by cold welding so as to form a substrate 1. Then, a joining-aide layer was formed such that a butyral resin dissolved in an organic solvent was applied to the substrate 1 to a thickness of 50 μm by using the doctor blade technique. On top of the layer, p-type silicon particles 2 having diameters of 0.3–0.5 mm were deposited several times so that the p-type silicon particles 2 were adequately bonded to the joining-aid layer, and then extra p-type silicon particles 2 were removed by inclining the substrate 1. Thereafter, with the p-type silicon particles 2 being kept pressed and still by application of a constant load, heat at a temperature of 630.degree.C. was applied for 10 minutes in atmospheric air so as to join the p-type silicon particles 2 to the aluminum alloy.

A fluorine-containing liquid repellant agent was applied onto the sample and dried at room temperature. Thereafter, a solution prepared by mixing polysiloxane, polycarbosilane, a glass filler, and xylene at a weight ratio of 1:1:0.15:4 was applied so as to fully cover the p-type silicon particles 2. After being dried at room temperature, the sample was heat treated at 330.degree.C. for 30 minutes. The glass used for the glass filler was mainly composed of SiO$_2$, B$_2$O$_3$, ZnO, Al$_2$O$_3$ and had an average particle size of 2.2 μm and an optical index of refraction of 1.5. The obtained transparent polysiloxane-polycarbosilane-glass filler composite 3 had a thickness of about 150 μm in an area where the p-type silicon particles 2 were densely deposited, and had a thickness of about 20 μm in an area where the p-type silicon particles 2 were not densely deposited.

Another polysiloxane-polycarbosilane-glass filler composite 3 was formed on a glass substrate under the same conditions, which had a pencil hardness of 2H, and a transmittance of 80% or more for light at wavelengths of 400–800 nm.

In order to clean the upper surfaces of the p-type silicon particles 2, the substrate 1 on which the polysiloxane-polycarbosilane-glass filler composite 3 was interposed among the p-type silicon particles 2 was immersed in a hydrofluoric acid-nitric acid mixture solution (HF:HNO$_3$=1:20) for 1 minute, and then thoroughly cleaned with pure water.

Subsequently, an n-type semiconductor layer 4 comprising a mixture of crystalline silicon and amorphous silicon was formed to a thickness of 50 nm on the p-type silicon particles 2 by plasma CVD method using a mixed gas containing a silane gas and small amount of a phosphorus compound, and then a 100 nm thick ITO film 5 was formed on the semiconductor layer 4 by sputtering.

After a pattern electrode comprising fingers and bus bars was formed on top of them, the photoelectric conversion efficiency was measured, and a relatively high conversion efficiency of 10.5% was achieved. The sample was subjected to 500 cycles of temperature cycling test at −40.degree.C. to 90.degree.C. As a result, no cracking or peeling occurred in the insulator 3 and the photoelectric conversion efficiency was 10.2%. Almost no property deterioration was observed.

Comparative Example 1-2a

A sample was fabricated under the same conditions as Example 1-2 except that a solution in which polysiloxane and polycarbosilane, a glass filler and xylene were mixed at a weight ratio of 1:0:0.075:2 was used for the insulator 3. A transparent sample without defects such as cracking and peeling was obtained. However, another insulator formed on a glass substrate under the same conditions had a pencil hardness of H. Although an initial photoelectric conversion efficiency of 8.2% was achieved, after the sample was subjected to 500 cycles of temperature cycle test at −40.degree.C. to 90.degree.C., cracking occurred in the insulator 3, resulting in a photoelectric conversion efficiency of 0%.

Comparative Example 1-2b

A sample was fabricated under the same conditions as Example 1-2 except that a solution in which polysiloxane, polycarbosilane, a glass filler and xylene were mixed at a weight ratio of 0:1:0.075:2 was used for the insulator 3. Cracking occurred all over the insulator 3, resulting in a photoelectric conversion efficiency of 0%.

Comparative Example 1-2c

A sample was fabricated under the same conditions as Example 1-2 except that a solution in which polysiloxane, polycarbosilane, a glass filler and xylene were mixed at a weight ratio of 1:1:0:4 was used for the insulator 3. Cracking occurred all over the insulator 3, resulting in a photoelectric conversion efficiency of 0%.

Example 1-3

A 50 μm thick aluminum alloy was attached onto a stainless steel base by cold welding so as to form a substrate 1. Then, a joining-aide layer was formed such that a butyral resin dissolved in an organic solvent was applied to the substrate 1 to a thickness of 50 μm by using the doctor blade technique. On top of the layer, p-type silicon particles 2 having diameters of 0.3–0.5 mm were deposited several times so that the p-type silicon particles 2 were adequately bonded to the joining-aid layer, and then extra p-type silicon particles 2 were removed by inclining the substrate 1. Thereafter, with the p-type silicon particles 2 being kept pressed and still by application of a constant load, heat at a temperature of 630.degree.C. was applied for 10 minutes in atmospheric air so as to join the p-type silicon particles 2 to the aluminum alloy.

A fluorine-containing liquid repellant agent was applied onto the sample and dried at room temperature. A solution of a hydrolyzate of tetraethoxysilane prepared by mixing tetraethoxysilane, isopropyl alcohol, and water containing 0.5% ammonia at a molar ratio of 1:2:1 was added to a solution preliminarily prepared by mixing polysiloxane, polycarbosilane and xylene at a weight ratio of 4:1:5 so that the weight ratio among the solid content of the hydrolyzate, polysiloxane, and polycarbosilane was 4:1:0.5 to produce a mixed solution. The mixed solution was applied so as to fully cover the p-type silicon particles 2. After being dried at room temperature, the sample was heat treated at 330.degree.C. for 30 minutes. The obtained transparent insulator 3 comprising the mixture of polysiloxane, polycarbosilane and a hydrolyzate of tetraethoxysilane had a thickness of about 150 μm in an area where the p-type silicon particles 2 were densely deposited, and had a thickness of about 10 μm in an area where the p-type silicon particles 2 were not densely deposited.

Another insulator 3 comprising the mixture of polysiloxane, polycarbosilane and a hydrolyzate of tetraethoxysilane was formed on a glass substrate under the same conditions, which had a pencil hardness of 2H, and a transmittance of 80% or more for light at wavelengths of 400–800 nm.

In order to clean the upper surfaces of the p-type silicon particles 2, the substrate 1 on which the insulator 3 comprising the mixture of polysiloxane, polycarbosilane and hydrolyzate of tetraethoxysilane was interposed among the p-type silicon particles 2 was immersed in a hydrofluoric acid-nitric acid mixture solution ($HF:HNO_3$=1:20) for 1 minute, and then thoroughly cleaned with pure water. Subsequently, an n-type semiconductor layer 4 comprising a mixture of crystalline silicon and amorphous silicon was formed to a thickness of 50 nm on the p-type silicon particles 2 by plasma CVD method using a mixed gas containing a silane gas and small amount of a phosphorus compound, and then a 100 nm thick ITO film 5 was formed on the semiconductor layer 4 by sputtering.

After a pattern electrode comprising fingers and bus bars was formed on top of them, the photoelectric conversion efficiency was measured, and a relatively high conversion efficiency of 9.5% was achieved. The sample was subjected to 500 cycles of temperature cycling test at −40.degree.C. to 90.degree.C. As a result, no cracking or peeling occurred in the insulator 3 and the photoelectric conversion efficiency was 9.2%. Almost no property deterioration was observed.

Comparative Example 1-3

A sample was fabricated under the same conditions as Example 1-3 except that a solution in which polysiloxane, polycarbosilane, a hydrolyzate of tetraethoxysilane, and xylene were mixed at a weight ratio of 4:1:5:3.5 was used for the insulator 3. Cracking occurred in the insulator 3, resulting in a photoelectric conversion efficiency of 0%.

Example 1-4

A 50 μm thick aluminum alloy was attached onto a stainless steel base by cold welding so as to form a substrate 1. Then, a joining-aide layer was formed such that a butyral resin dissolved in an organic solvent was applied to the substrate 1 to a thickness of 50 μm by using the doctor blade technique. On top of the layer, p-type silicon particles 2 having diameters of 0.3–0.5 mm were deposited several times so that the p-type silicon particles 2 were adequately bonded to the joining-aid layer, and then extra p-type silicon particles 2 were removed by inclining the substrate 1. Thereafter, with the p-type silicon particles 2 being kept pressed and still by application of a constant load, heat at a temperature of 630.degree.C. was applied for 10 minutes in atmospheric air so as to join the p-type silicon particles 2 to the aluminum alloy.

A fluorine-containing liquid repellant agent was applied onto the sample and dried at room temperature. A solution of a hydrolyzate of tetraethoxysilane prepared by mixing tetraethoxysilane, isopropyl alcohol, and water containing 0.5% ammonia at a molar ratio of 1:2:1 was added to a solution preliminarily prepared by mixing polysiloxane, polycarbosilane and xylene at a weight ratio of 4:1:5 so that the weight ratio among the solid content of the hydrolyzate, polysiloxane, and polycarbosilane was 4:1:0.5 to produce a mixed solution. A glass filler was further added to the mixed solution so that the weight ratio among the glass filler, polysiloxane and polycarbosilane was 4:1:0.05. The glass used for the glass filler was mainly composed of $SiO_2$, $B_2O_3$, ZnO, and $Al_2O_3$ and had an average particle size of 2.2 μm and an optical index of refraction of 1.5. The resultant mixed solution was applied so as to fully cover the p-type silicon particles 2. After being dried at room temperature, the sample was heat treated at 330.degree.C. for 30 minutes. The obtained transparent insulator 3 comprising the mixture of polysiloxane, polycarbosilane, a hydrolyzate of tetraethoxysilane and an inorganic filler had a thickness of about 150 μm in an area where the p-type silicon particles 2 were densely deposited, and had a thickness of about 10 μm in an area where the p-type silicon particles 2 were not densely deposited.

Another insulator 3 comprising the mixture of polysiloxane, polycarbosilane, a hydrolyzate of tetraethoxysilane and an inorganic filler was formed on a glass substrate under the same conditions, which had a pencil hardness of 2H, and a transmittance of 80% or more for light at wavelengths of 400–800 nm.

In order to clean the upper surfaces of the p-type silicon particles 2, the substrate 1 on which the insulator 3 was interposed among the p-type silicon particles 2 was immersed in a hydrofluoric acid-nitric acid mixture solution ($HF:HNO_3=1:20$) for 1 minute, and then thoroughly cleaned with pure water.

Subsequently, an n-type semiconductor layer 4 comprising a mixture of crystalline silicon and amorphous silicon was formed to a thickness of 50 nm on the p-type silicon particles 2 by plasma CVD method using a mixed gas containing a silane gas and small amount of a phosphorus compound, and then a 100 nm thick ITO film 5 was formed on the semiconductor layer 4 by sputtering.

After a pattern electrode comprising fingers and bus bars was formed on top of them, the photoelectric conversion efficiency was measured, and a relatively high conversion efficiency of 9.4% was achieved. The sample was subjected to 500 cycles of temperature cycling test at −40.degree.C. to 90.degree.C.. As a result, no cracking or peeling occurred in the insulator 3 and the photoelectric conversion efficiency was 9.3%. Almost no property deterioration was observed.

<Photoelectric Conversion Device and Manufacturing Process thereof 2>

Figure 3:
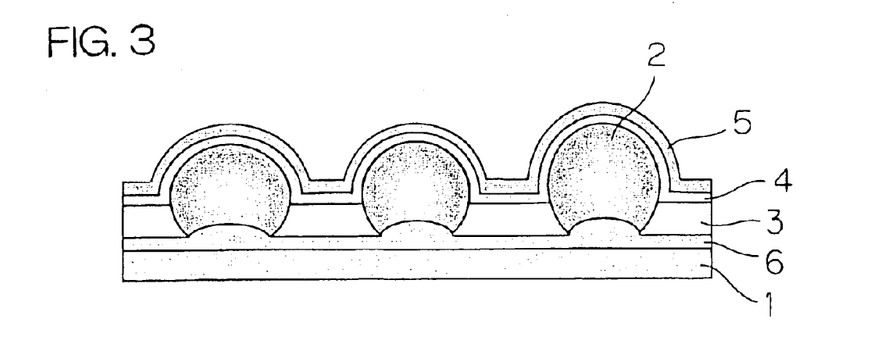
FIG. 3 is a cross-sectional view showing a photoelectric conversion device which can be provided by a manufacturing process thereof according to the present invention.

FIG. 3 is a cross-sectional view showing a photoelectric conversion device obtained by a manufacturing process of photoelectric conversion device according to the present invention. In FIG. 3, there are shown a substrate 1, crystalline semiconductor particles 2, an insulator 3, a semiconductor layer 4 of a conductivity type opposite to that of the crystalline semiconductor particles 2, a conductive layer 5, and an alloy layer 6 comprising an alloy of the substrate 1 and crystalline semiconductor particles 2.

In FIG. 3, the substrate 1 is formed of aluminum or a combined substrate having aluminum as the surface layer. For the base of a combined substrate, metal or ceramics having a melting point higher than that of aluminum may be used. For example, iron, stainless steel, invar, iron alloys such as Fe—Co—Ni alloys of low expansion coefficient, nickel, or ceramics such as alumina are used.

Numerous crystalline semiconductor particles 2 of a first conductivity type are deposited on the substrate 1. The crystalline semiconductor particles 2 comprise Si doped with small amount of a p-type impurity such as B, Al or Ga, or Si doped with small amount of an n-type impurity such as P or As. The shapes of the crystalline semiconductor particles may be polygons, curved surfaces, or the like. The particle size may be even or uneven. However, uneven particle sizes will be advantageous to make the device more economical, because an additional process is necessary in order to uniformize the particle sizes. Also, having convex surfaces reduces the dependence on the incident angle of light.

Preferably, the particle sizes of the crystalline semiconductor particles 2 are in the range of 0.2–1.0 mm. Using crystalline semiconductor particles with particle sizes exceeding 1.0 mm makes no difference in quantity of silicon from the amount used in conventional crystal plate type photoelectric conversion devices including the amount of ground part, which nullifies the advantage of using crystalline semiconductor particles 2. In addition, crystalline semiconductor particles 2 with diameters less than 0.2 mm are difficult to be deposited on the substrate 1, which is another problem. More desirably, the particle sizes are in the range of 0.2–0.6 mm, considering the amount of silicon for use.

The insulator 3 comprises an insulating material for separating the positive electrode from the negative electrode, and one of the following (1)–(5) is used for the insulator 3: (1) glass powder (2) heat-resistant polymeric material (3) mixture of heat-resistant polymeric material and inorganic filler (4) organic-inorganic composite containing Si (5) mixture of organic-inorganic composite containing Si and inorganic filler.

The semiconductor layer 4 comprises, for example, Si, and is formed by a vapor-phase growth method or the like in which, for example, a vapor-phase phosphorus-containing compound that is an n-type impurity or a vapor-phase boron-containing compound that is a p-type impurity is introduced in small amount into a vapor-phase silane compound. The semiconductor layer 4 may be of crystalline, amorphous, or mixture of crystalline and amorphous quality. When the light transmittance is taken into consideration, it is preferable that the layer is of crystalline or mixture of crystalline and amorphous quality.

As for the light beam transmittance, a part of incident light penetrates the semiconductor layer 4 at areas where the crystalline semiconductor particles 2 are not present, and is reflected by the substrate 1 and directed to the crystalline semiconductor particles 2. This enables energy of light incident on the whole photoelectric conversion device to be efficiently transmitted to the crystalline semiconductor particles 2.

In addition, the semiconductor layer 4 preferably is formed along the contours of the convex surfaces of the crystalline semiconductor particles 2. By forming the semiconductor layer 4 along the convex surfaces of the crystalline semiconductor particles 2, large area can be provided for p-n junctions. Accordingly, carriers generated inside the crystalline semiconductor particles 2 can be efficiently collected. Meanwhile, when the crystalline semiconductor particles 2 to be used each have a surface layer containing small amount of an n-type impurity such as P or As, or a p-type impurity such as B, Al or Ga, the semiconductor layer 4 may be spared, and the conductive layer 5 is formed directly over the crystalline semiconductor particles 2.

The conductive layer 5 is formed by a film-forming process such as sputtering or vapor-phase growth method, or a coat and fire process to form an oxide-based film composed of one or a plurality of compounds selected from the group consisting of $SnO_2$, $In_2O_3$, ITO, ZnO, $TiO_2$ and the like, or a metal-based film composed of one or a plurality of metals selected from the group consisting of Ti, Pt, Au and the like. In addition, such a conductive layer 5 needs to be transparent so that a part of incident light penetrates the conductive layer 5 at areas where the crystalline semiconductor particles 2 are not present, and is reflected by the substrate 1 and directed to the crystalline semiconductor particles 2. This enables energy of light incident on the whole photoelectric conversion device to be efficiently transmitted to the crystalline semiconductor particles 2.

The transparent conductive layer 5 can have the effect of an antireflective film if the thickness is selected for that purpose. In addition, the conductive layer 5 preferably is formed along the contour of the semiconductor layer 4 or along the convex surfaces of the crystalline semiconductor particles 2. By forming the conductive layer 5 along the convex surfaces of the crystalline semiconductor particles 2, large area can be provided for p-n junctions. Accordingly, carriers generated inside the crystalline semiconductor particles 2 can be efficiently collected.

A protective layer (not shown) may be formed on the semiconductor layer 4 or on the conductive layer 5. It is preferable for such a protective layer to have the properties of a transparent dielectric. It is formed by the CVD method, the PVD method or the like, in which, for example, one or a plurality of materials selected from the group consisting of silicon oxide, cesium oxide, aluminum oxide, silicon nitride, titanium oxide, $SiO_2$—$TiO_2$, tantalum oxide, yttrium oxide are used to form a single layer or a combined layer on the semiconductor layer 4 or on the conductive layer 5. The protective layer needs to have transparency, because it is in contact with the surface where light is incident, and in order to prevent current leakage from occurring between the outside and the semiconductor layer 4 or the conductive layer 5, it needs to be a dielectric. It is possible to provide the protective layer with the function of an antireflective film by optimizing the thickness of the layer for that purpose.

Moreover, it is also possible to provide a pattern electrode (not shown) comprising fingers and bus bars at regular intervals on the semiconductor layer 4 or on the conductive layer 5 so that the patterned electrode is directly or indirectly connected to the semiconductor layer 4 so as to lower the series resistance, thereby improving the conversion efficiency.

Figure 4A:
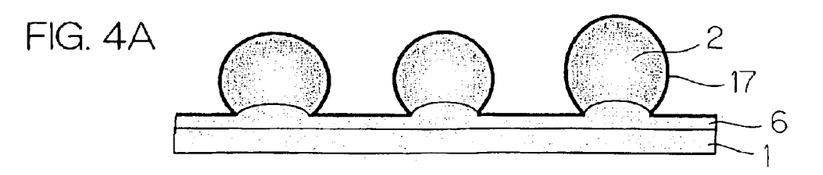
FIG. 4A is a cross-sectional view showing one embodiment of the manufacturing process according to the present invention, which illustrates a state in which a coating having liquid repellency is formed on the crystalline semiconductor particles and the substrate.
Figure 4B:
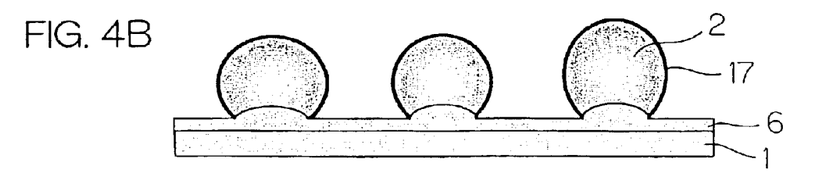
FIG. 4B is a cross-sectional view showing the embodiment of the manufacturing process according to the present invention, which illustrates a state in which only the liquid repellency on the substrate is selectively removed.
Figure 4C:
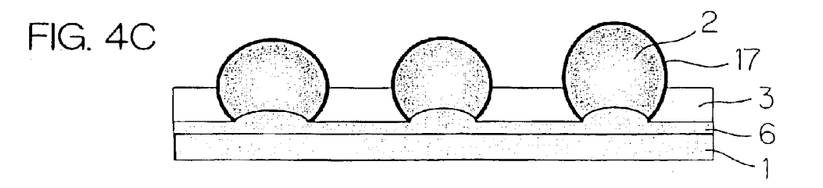
FIG. 4C is a cross-sectional view showing the embodiment of the manufacturing process according to the present invention, which illustrates a state in which an insulator is formed among the crystalline semiconductor particles.

FIGS. 4A–4C are cross-sectional views showing a manufacturing process of photoelectric conversion device according to one embodiment of the present invention. FIG. 4A illustrates a cross-section where a coating 17 having liquid repellency is formed on both a substrate 1 and crystalline semiconductor particles 2, and FIG. 4B illustrates the cross-section where only the coating 17 on the substrate 1 is selectively removed. FIG. 4C illustrates the cross-section where an insulator 3 is further formed.

For the coating having liquid repellency, compounds having a long chain alkyl group or perfluoroalkyl group are used as effective materials. In particular, fluorine-containing silane coupling agents, perfluorosilicone, perfluoropolysilaxane and the like are used as the material. The coating is adapted to exert various degrees of repellency according to the chemical formula and modified process. These materials for the coating are dissolved in a solvent to produce a solution of a liquid-repellent agent. An appropriate liquid-repellent agent may be selectively employed according to the handling factors such as the particle size of the crystalline semiconductor particles 2, the space among the crystalline semiconductor particles 2, the spreadability and drying characteristics.

At the stage of FIG. 4A, a process for forming the coating 17 having liquid-repellency tenmporalily on both the substrate 1 and crystalline semiconductor particles 2 is carried out as follows. After a predetermined amount of a solution containing a liquid-repellent agent is applied to the substrate 1 to which the crystalline semiconductor particles 2 are joined, the solvent is dried. The application of the solution may be carried out under reduced pressure so as to distribute the solution among the crystalline semiconductor particles 2. In order that the desired repellency is exhibited, processes such as heating at a predetermined temperature for a predetermined time and cleaning with a prescribed solvent may be added after the drying of the solvent.

At the stage of FIG. 4B, a process for selectively removing only the repellency on the substrate 1 is carried out as follows. An aqueous solution of a strong base such as sodium hydroxide, potassium hydroxide, calcium hydroxide or the like, or a hydrofluoric acid or hydrofluoric acid-nitric acid etching solution is used for the treatment. The density of the aforesaid strong base aqueous solution is preferably 0.1–10%, and more preferably, 0.5–5%. The density of the hydrofluoric acid or hydrofluoric acid-nitric acid etching solution is preferably 0.05–5%, and more preferably, 0.3–3%. The treatment time, while it depends on the kind and density of the employed solution, may be from several seconds to several minutes. The treatment temperature is lower than 80.degree.C., and preferably, room temperature in view of workability. In addition, the treatment with the aforesaid solution may be carried out under reduced pressure so as to distribute the solution among the crystalline semiconductor particles 2.

As an alternative method for selectively removing only the repellency on the substrate 1, for example, a method in which $TiO_2$ fine particles are deposited on the substrate 1 and the coating 17 having liquid-repellency is decomposed by UV irradiation may be used. The deposition of $TiO_2$ fine particles on the substrate 1 may be carried out such that $TiO_2$ fine particles are deposited directly from above the substrate 1, or such that a suspension in which $TiO_2$ fine particles are dispersed in a prescribed solvent or a $TiO_2$ colloidal solution is applied onto the substrate 1. Or, alternatively, it may be carried out such that after a solution that produces $TiO_2$ fine particles upon heating or hydrolysis is applied onto the substrate 1, it is heated at a temperature below 300.degree.C. Ti alkoxide, or an oligomer of a partially hydrolyzed Ti alkoxide or the like is used as the solution that produces $TiO_2$ fine particles upon heating or hydrolysis. In cases where UV irradiation is performed after $TiO_2$ fine particles are deposited or a solution thereof is applied and heated and then dried, the direction of the irradiation or the orientation of the substrate 1 maybe changed as appropriate so that the surface is effectively irradiated by UV rays.

After the process for selectively removing only the repellency on the substrate 1 is carried out, cleaning with water or alcohol is performed to remove the solution or fine particles used for the process. The cleaning may be performed under reduced pressure so as to distribute the cleaning liquid among the crystalline semiconductor particles 2, or may be accompanied with ultrasonic cleaning.

At the stage of FIG. 4C, a process for forming the insulator 3 is carried out as follows. A solution or liquid dispersion of one of the insulating materials (1)–(5) is applied, dried and then heat treated at a predetermined temperature. The application of the solution or liquid dispersion may be carried out under reduced pressure so as to distribute the solution among the crystalline semiconductor particles 2. Or, a cleaning process with a predetermined solvent may be added after the drying process.

When any of the insulating materials is used, it is preferred that the heat treatment temperature is lower than 577.degree.C. When the heat treatment temperature is 577.degree.C. or higher, the alloy layer 6 of aluminum and silicon begins to melt, so that the contact between the substrate 1 and the crystalline semiconductor particles 2 becomes unstable. In some cases, the crystalline semiconductor particles 2 leave the substrate 1, which makes it impossible to collect the generated electric current.

When the insulating material is a glass, although the composition of the glass is not particularly limited, the glass transition point thereof is preferably not higher than 515.degree.C. When the glass transition point is higher than 515.degree.C., the material does not melt at temperatures around 577.degree.C., failing to fill the spaces among the crystalline semiconductor particles 2, consequently failing to function as insulator 3.

The solvent for dispersing the glass powder may be polyvinyl alcohol, n-dibutylphthalate, α-terpineol or the like, and the slurry density is preferably 20–40% by weight.

When the insulating material is heat-resistant polymeric material or a mixture of a heat-resistant polymeric material and an inorganic filler, for example, polyimide, polybenzimidazole, polyamide-imide or the like may be used as the heat-resistant polymeric material. Glass, $SiO_2$ or the like may be used as the inorganic filler. The solvent used in such a case may be dimethylformamide, dimethylacetamide, N-methyl pyrrolidone or the like, and the density is preferably 10–40% by weight.

When the insulating material is an organic-inorganic composite containing Si or a mixture of an organic-inorganic composite containing Si and an inorganic filler, a material such as a thermosetting transparent organic-inorganic composite mainly composed of polysiloxane or a mixture of polysiloxane and polycarbosilane may be used as the organic-inorganic composite containing Si. Glass, $SiO_2$ or the like may be used as the inorganic filler. The organic solvent used in such a case may be benzene, toluene, xylene hexane, tetrahydrofuran or the like, and the density is preferably 10–50% by weight.

Figure 5A:
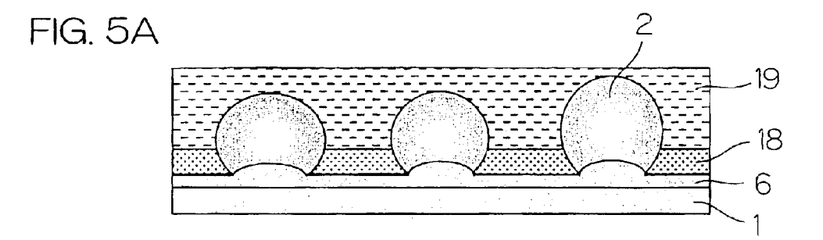
FIG. 5A is a cross-sectional view showing another embodiment of the manufacturing process according to the present invention, which illustrates a state in which a solution of a liquid repellent agent is applied so that the crystalline semiconductor particles are immersed in the solution.
Figure 5B:
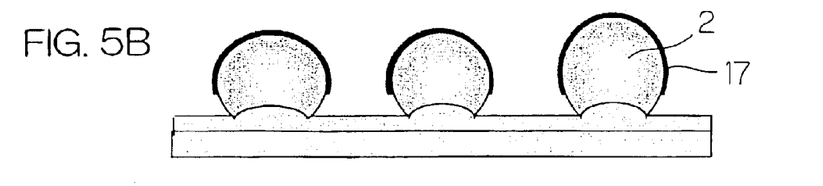
FIG. 5B is a cross-sectional view showing the other embodiment of the manufacturing process according to the present invention, which illustrates a state in which a coating having liquid repellency is formed on the crystalline semiconductor particles.
Figure 5C:
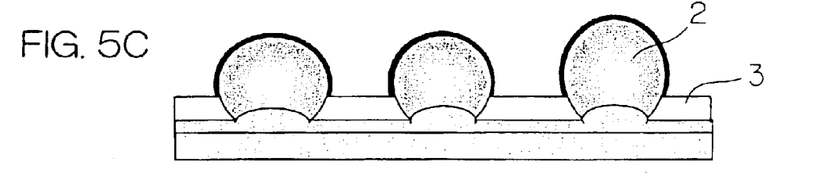
FIG. 5C is a cross-sectional view showing the other embodiment of the manufacturing process according to the present invention, which illustrates a state in which an insulator is formed among the crystalline semiconductor particles.

FIGS. 5A–5C illustrates cross-sections showing another embodiment of the manufacturing process of photoelectric conversion device according to the present invention. FIG. 5A illustrates a state where a liquid 18 is filled up to approximately half or less the height of the crystalline semiconductor particles 2, and a liquid 19 in which a liquid-repellent agent is dissolved is applied onto the liquid 18 so that the crystalline semiconductor particles 2 are fully immersed therein. FIG. 5B illustrates a state after that of FIG. 5A, where the both of the liquids are removed and a coating having liquid-repellency 17 is formed on the crystalline semiconductor particles 2. FIG. 5C illustrates a state where the insulator 3 is further formed. In FIG. 5A, the liquid 18 is a liquid having a large specific gravity for covering the substrate, and the liquid 19 has a smaller specific gravity than the liquid 18 and comprises a liquid immiscible with the liquid 18 and a liquid-repellent agent dissolved therein.

In FIG. 5A, the combination of the liquid 18 for covering the substrate 1 having a large specific gravity and the liquid 19 immiscible with the liquid 18 which has a smaller specific gravity than the liquid 18 and contains a liquid-repellent agent dissolved therein may be, for example, water and petroleum ether solution, water and xylene solution, water and toluene solution, carbon tetrachloride, aqueous solution, or the like.

In FIG. 5A, the method for filling the liquid 18 up to approximately half or less the height of the crystalline semiconductor particles 2 may be spin coating, a method by means of a dispenser, dipping or the like. If dipping is used, the process may be accompanied with pressure reduction so as to distribute the cleaning liquid among the crystalline semiconductor particles 2. As the method for applying the solution 19 of liquid-repellent agent so as to fully immerse the crystalline semiconductor particles therein, a method by means of a dispenser is employed. After the double layer structure of the liquid 18 and the solution 19 of liquid-repellent agent is formed, it may be kept still for several seconds to several minutes. Thus, a part of or the entire solvent of the solution 19 of liquid-repellent agent is volatilized.

In FIG. 5B, as the method for removing both of the liquids, a process is carried out such that with the substrate 1 held horizontal, the whole assembly is immersed in the liquid 18 having a large specific gravity. This process maybe accompanied with an ultrasonic treatment. Thereafter, it is cleaned with the liquid 18 or alcohol, and then dried.

In FIG. 5C, the same process as in FIG. 4C may be used as the method for forming the insulator 3.

EXAMPLE 2

Now, the present invention is described by way of example.

Example 2-1

A 50 μm thick aluminum alloy was attached onto a stainless steel base by cold welding so as to form a substrate 1. Then, a joining-aide layer was formed such that a butyral resin dissolved in an organic solvent was applied to the substrate 1 to a thickness of 50 μm by using the doctor blade technique. On top of the layer, p-type silicon particles 2 having diameters of 0.3–0.5 mm were deposited several times so that the p-type silicon particles 2 were adequately bonded to the joining-aid layer, and then extra p-type silicon particles 2 were removed by inclining the substrate 1. Thereafter, with the p-type silicon particles 2 being kept pressed and still by application of a constant load, heat at a temperature of 630.degree.C. was applied for 10 minutes in atmospheric air so as to join the p-type silicon particles 2 to the aluminum alloy.

A 0.5% solution of perfluoroalkylsilane coupling agent in xylene was applied onto the sample and then dried at room temperature. After the sample was immersed in a 1% aqueous solution of sodium hydroxide for 3 minutes to remove the repellency on the substrate 1, it was cleaned with water and isopropyl alcohol, and then dried at 60.degree.C. for 10 minutes. A liquid dispersion containing 30% by weight of a low temperature-fireable glass powder dispersed in n-dibutyl phthalate was applied to the sample and dried at 150.degree.C. for 10 minutes, and then cleaned with small amount of α-terpineol, in which the glass powder was composed of $B_2O_3$, ZnO, $SiO_2$, $Al_2O_3$, $Li_2O$, and $SnO_2$ and had an average particle size of 2.2 μm and a glass transition point of 505.degree.C. Thereafter, it was fired at 570.degree.C. for 30 minutes to form a transparent glass insulator 3 among the silicon particles 2.

In order to clean the upper surfaces of the p-type silicon particles 2, the substrate 1 on which the insulator 3 comprising glass was interposed among the p-type silicon particles 2 was immersed in a hydrofluoric acid-nitric acid mixture solution ($HF:HNO_3$=1:20) for 1 minute, and then thoroughly cleaned with pure water.

Subsequently, an n-type semiconductor layer 4 comprising a mixture of crystalline silicon and amorphous silicon was formed to a thickness of 50 nm on the p-type silicon particles 2 by plasma CVD method using a mixed gas containing a silane gas and small amount of a phosphorus compound, and then a 100 nm thick ITO film 5 was formed on the semiconductor layer 4 by sputtering. The insulator 3 had no cracking or peeling, and the ratio of pn-junction planes on the crystalline semiconductor particles 2 i.e., the aperture ratio, was 85%.

After a pattern electrode comprising fingers and bus bars was formed on top of them, the photoelectric conversion efficiency was measured, and a relatively high conversion efficiency of 9.3% was achieved.

Example 2-2

A 0.1% solution of perfluorosilicone in isopropyl alcohol was applied to an aluminum alloy substrate 1 to which p-type silicon particles 2 were joined in the same manner as in Example 1, and dried at room temperature. The sample was immersed in a 0.5% aqueous solution of hydrofluoric acid for 2 minutes at room temperature to remove the repellency on the substrate 1, and cleaned with water and isopropyl alcohol, and then dried at 60.degree.C. for 10 minutes. A 25% solution of polyimide in N-methyl pyrrolidone was applied onto the sample and dried at 150.degree.C. for 10 minutes. Thereafter, the sample was fired at 350.degree.C. for 20 minutes to form a light brown, heat-resistant polymer insulator 3. After it was treated with a hydrofluoric acid-nitric acid mixture liquid as in Example 1, a semiconductor layer 4 and an ITO film 5 were successively formed. The insulator 3 had no cracking or peeling, and the aperture ratio was 90%.

After a pattern electrode comprising fingers and bus bars was further formed, the photoelectric conversion efficiency was measured. A relatively high conversion efficiency of 9.6% was achieved.

Example 2-3

A 3% solution of perfluoropolysilaxane in toluene was applied to an aluminum alloy substrate 1 to which p-type silicon particles 2 were joined in the same manner as in Example 1, and dried at room temperature. After a TiO$_2$ sol prepared by mixing Ti(O-i-Pr)4, i-PrOH, H$_2$O, and HCl at a molar ratio of 1:80:10:0.05 was applied to remove the repellency of the substrate 1, heat treatment was performed at 200.degree.C. for 1 hour, thereby forming a TiO$_2$ dry gel coating on the substrate 1. The sample was irradiated in a UV irradiation unit with a metal halide lamp, with an output of 3 kW for 15 seconds, and then cleaned with 0.1% hydrochloric acid to remove the TiO$_2$ dry gel. Then, the sample was cleaned with water and isopropyl alcohol and dried at 60.degree.C. for 10 minutes. A 30% solution of polysiloxane containing a phenyl group in xylene was applied onto the sample and dried at 80.degree.C. for 10 minutes. Thereafter, it is fired at 300.degree.C. for 20 minutes to form a transparent insulator 3 of an organic-inorganic composite. After the sample was treated with a hydrofluoric acid-nitric acid mixture liquid in the same manner as Example 1, a semiconductor layer 4 and an ITO film 5 were formed thereon. The insulator 3 had no cracking or peeling, and the aperture ratio was 90%.

After a pattern electrode comprising fingers and bus bars was further formed, the photoelectric conversion efficiency was measured. A relatively high conversion efficiency of 9.5% was achieved.

What is claimed is:

1. A photoelectric conversion device comprising:

a substrate having an electrode of one side;

numerous crystalline semiconductor particles containing silicon of one conductivity type which are deposited on the substrate and joined thereto;

an insulator interposed among the crystalline semiconductor particles;

a semiconductor layer of the opposite conductivity type provided on the crystalline semiconductor particles;

and an electrode of another side connected to the semiconductor layer of the opposite conductivity type, wherein the insulator comprises a mixture or reaction product of polysiloxane and polycarbosilane.

2. The photoelectric conversion device according to claim 1, wherein the crystalline semiconductor particles have an average particle size of 0.2 to 1.0 mm.

3. The photoelectric conversion device according to claim 1, wherein the weight ratio of the polycarbosilane to the polysiloxane in the insulator is not less than 0.1 and not more than 1.0.

4. The photoelectric conversion device according to claim 1, wherein the insulator has a transmittance of 70% or more for light at wavelengths of 400–800 nm.

5. The photoelectric conversion device according to claim 1, wherein the insulator has a thickness of not less than 3 $\mu$m and not more than 250 $\mu$m.

6. The photoelectric conversion device according to claim 1, wherein the insulator has a pencil hardness of not less than HB and not more than 3H.

7. The photoelectric conversion device according to claim 1, wherein the substrate comprises aluminum or a combined material having an aluminum surface.

8. The photoelectric conversion device according to claim 1, wherein an inorganic filler is added to the mixture or reaction product of polysiloxane and polycarbosilane.

9. The photoelectric conversion device according to claim 8, wherein the weight ratio of the polycarbosilane to the polysiloxane in the insulator is not less than 0.1 and not more than 2.0.

10. The photoelectric conversion device according to claim 8, wherein the inorganic filler comprises SiO$_2$ or a glass containing SiO$_2$.

11. The photoelectric conversion device according to claim 8, wherein the weight ratio of the inorganic filler to the total solid content of the polysiloxane and polycarbosilane is not more than 0.25.

12. The photoelectric conversion device according to claim 8, wherein the inorganic filler has an average particle size of not less than 0.1 $\mu$m and not more than 10 $\mu$m.

13. The photoelectric conversion device according to claim 8, wherein the inorganic filler has an optical index of refraction of not less than 1.4 and not more than 1.7.

14. The photoelectric conversion device according to claim 8, wherein the insulator has a transmittance of 70% or more for light at wavelengths of 400–800 nm.

15. The photoelectric conversion device according to claim 8, wherein the insulator has a thickness of not less than 3 $\mu$m and not more than 250 $\mu$m.

16. The photoelectric conversion device according to claim 8, wherein the insulator has a pencil hardness of not less than HB and not more than 4H.

17. The photoelectric conversion device according to claim 8, wherein the substrate comprises aluminum or a combined material having an aluminum surface.

* * * * *